United States Patent [19]

Suzuki et al.

[11] 4,318,117

[45] Mar. 2, 1982

[54] MOS INTEGRATED CIRCUIT

[75] Inventors: Yasoji Suzuki, Kawasaki; Minoru Takada, Omorinishi; Yasushi Satoh; Hiroshi Osanai, both of Oita, all of Japan

[73] Assignee: Tokyo Shibaura Denki Kabushiki Kaisha, Japan

[21] Appl. No.: 93,201

[22] Filed: Nov. 13, 1979

[30] Foreign Application Priority Data

Nov. 13, 1978 [JP] Japan .................. 53-139526

[51] Int. Cl.³ .................................. H01L 27/04
[52] U.S. Cl. ............................. 357/42; 357/41; 357/86; 357/89
[58] Field of Search .................. 357/42, 89, 86, 41

[56] References Cited

PUBLICATIONS

RCA COS/MOS IC's Manual, Tech. Series CMS-270, (RCA, Somerville, N.J., 1971) pp. 24–26.

Primary Examiner—William D. Larkins
Attorney, Agent, or Firm—Finnegan, Henderson, Farabow, Garrett & Dunner

[57] ABSTRACT

A MOS integrated circuit including P-channel MOS transistors, particularly for C-MOS inverter, in which the P-channel MOS transistor (12) has P+ drain (34), P+ source (36) connected to a +VDD circuit (42) via P+ and N+ diffusion layers ($36_1$, $36_2$) and isolation gate (38). The P+ layer is partly replaced by, i.e. parallel- and/or serial-connected to the N+ layer so that an effective source diffusion resistance ($R_S$) or the conductive resistance ($R_0$) is lowered.

7 Claims, 16 Drawing Figures

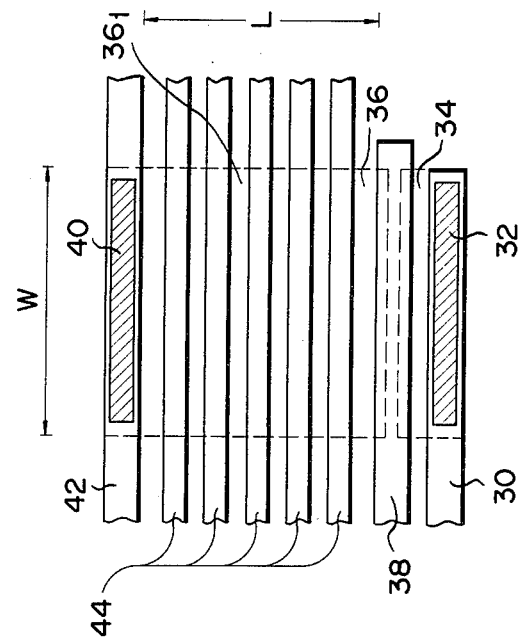
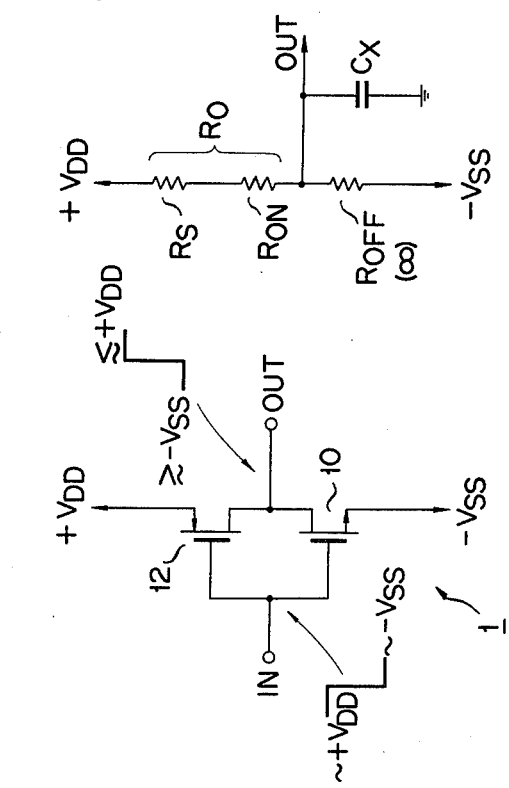
FIG. 1  FIG. 2  FIG. 3

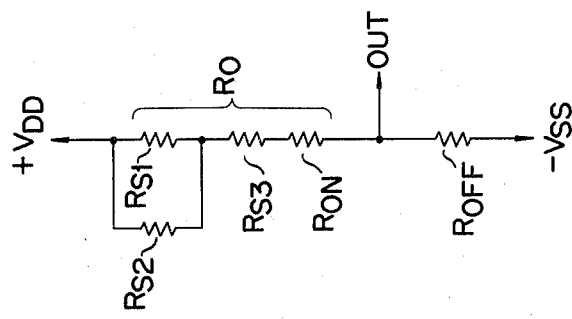
FIG. 5
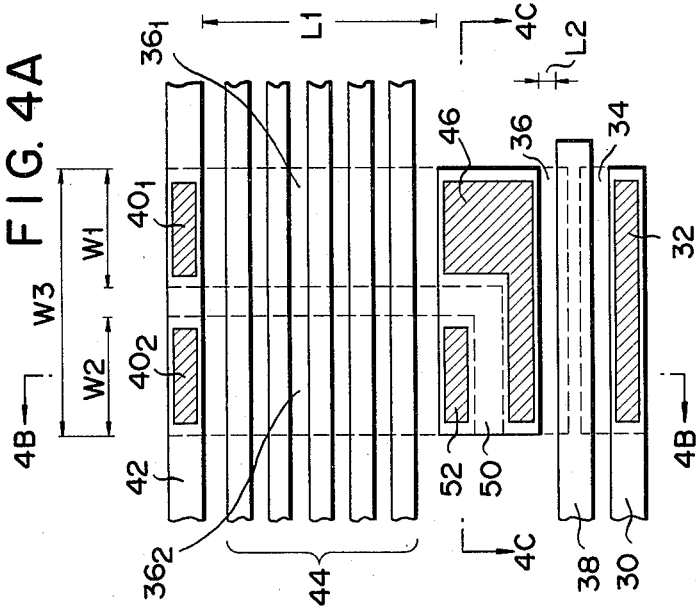
FIG. 4A
FIG. 4B
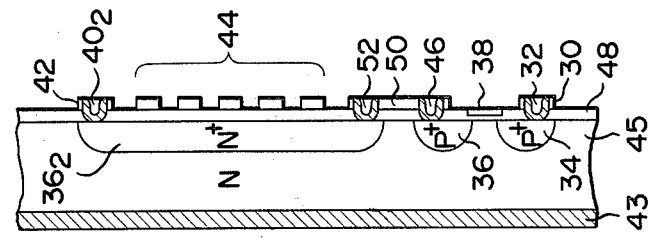
FIG. 4C

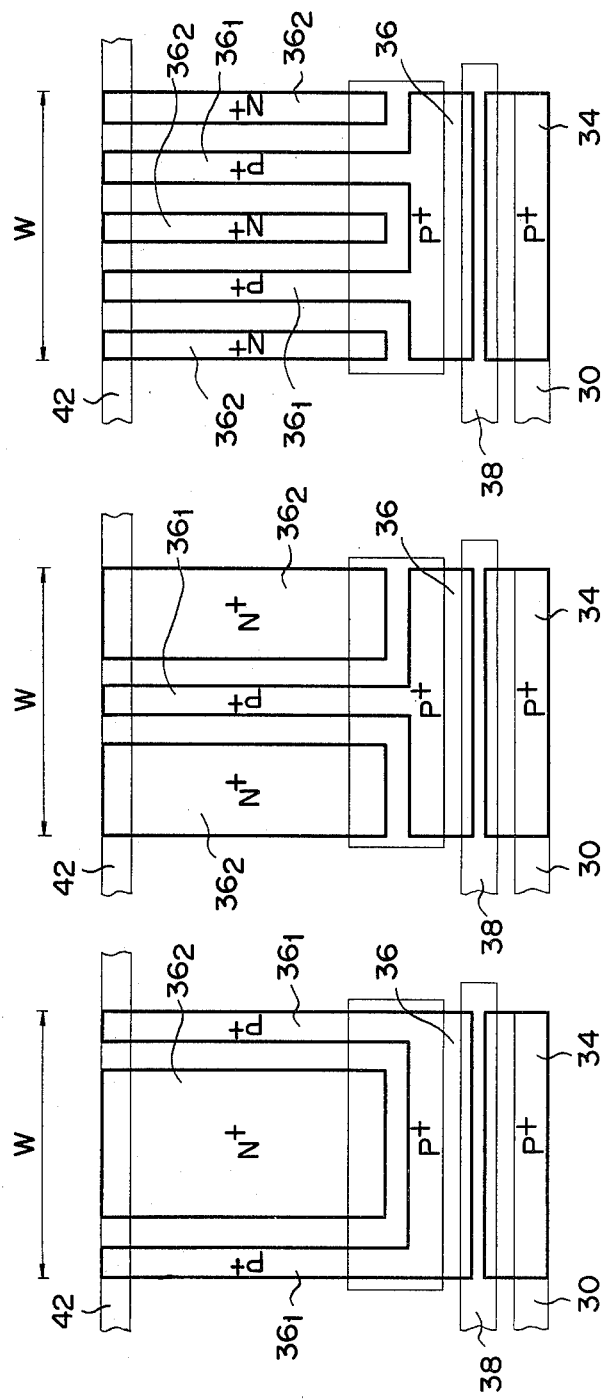

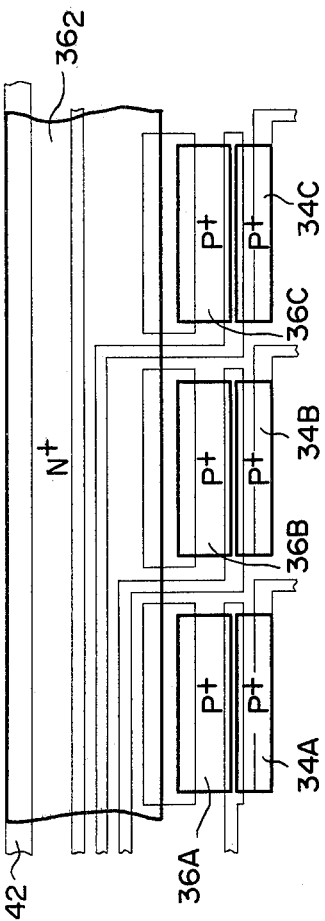
F I G. 11
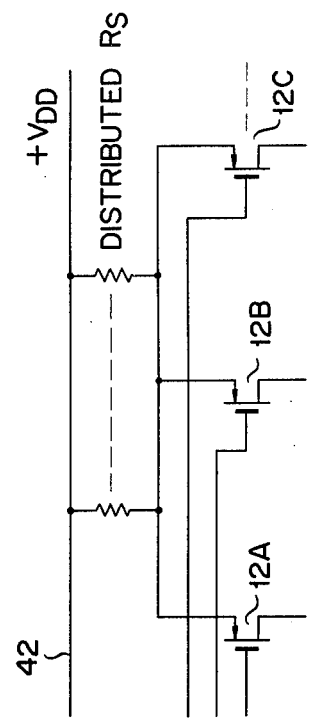
F I G. 12

MOS INTEGRATED CIRCUIT

BACKGROUND OF THE INVENTION

This invention relates to a MOS integrated circuit including an isolation gate type FET.

In a MOS integrated circuit of, for example, a symmetrical complementary metal oxide semiconductor (C-MOS) type, other circuit patterns are often formed, from the IC pattern design consideration, between the source electrode of a MOS transistor and the source electrode circuit i.e. a source power supply circuit (+VDD or −VSS). Such circuit patterns are used primarily for connection between elements in an IC chip or between these elements and external terminals. The reason why such circuit patterns are formed between the source electrode and the source power supply circuit is as follows. The circuit pattern made of an electroconductive material is formed on a semiconductor pattern with an insulation or possivation film such as $SiO_2$ therebetween. Thus, a capacitor is formed between the circuit pattern and the semiconductor pattern. If such a capacitor is formed on the drain pattern side of the MOS transistor an output capacitance is increased, lowering the switching speed. The source pattern side of the MOS transistor is connected to the source power supply circuit where a potential is at a substantially zero level, and shows a lower circuit impedance. If, therefore, an additional capacitance is formed by the circuit pattern there is no possibility that the switching speed of the MOS transistor will be lowered due to the presence of the additional capacitance.

For the above-mentioned reason, there is more chance that the circuit pattern will be formed between the source electrode of MOS transistors and the source power supply circuit unless there is no particular design requirement. Where in this way many circuit patterns are formed at the source side of the MOS transistors, a greater spacing is necessarily required between the source electrode and the source power supply circuit. An electrical connection between the source electrode and the source power supply circuit is provided by a high impurity concentration N+ or P+ layer from the standpoint of an IC manufacturing process. For example, the source electrode of the p-channel MOS transistor is provided by a P+ layer formed in an N-type substrate and a connection between the source electrode and the source power supply circuit is effected through the P+ layer. The P+ layer, unlike a metal, has a relatively high resistivity. For this reason, if a spacing between the source electrode and the source power supply circuit is made greater, a source diffusion resistance $R_S$ of appreciable value will be formed in the source circuit of the MOS transistor. The source diffusion resistance $R_S$ provides a current negative-feedback effect on a source-grounded MOS transistor. This current negative-feedback increases an output impedance of the MOS transistor and decreases an effective or equivalent transconductance gm. The diffusion resistance $R_S$ also increases an output resistance Ro when the MOS transistor is completely in the conductive state (such resistance is hereinafter referred to as a turn-ON resistance). An increase in the turn-ON resistance lowers the maximum output current of the MOS transistor. The decrease of the transconductance gm and increase of the output impedance increases the time constant of an integrator circuit comprising an output capacitance and an output impedance and, as a result, the switching speed is lowered. When a greater diffusion resistance is formed in the source circuit of the MOS transistor the maximum output current or fan-out is decreased with the result that the switching speed is lowered.

The same thing can also be said about an N-channel MOS transistor formed in a P+ type substrate.

SUMMARY OF THE INVENTION

The object of this invention is to provide a MOS integrated circuit having an improved switching speed.

To attain this object, a MOS integrated circuit of this invention comprises a MOS integrated circuit including a first conductivity type MOS transistor formed on a substrate in which the source of said MOS transistor is connected to one power supply circuit through a second conductivity type diffusion layer.

Suppose that in the above-mentioned MOS integrated circuit the first conductivity type is a P-type and the second conductivity type an N-type. In this case, the resistivity $\rho_N$ of an N+ layer can be made smaller than the resistivity $\rho_P$ of a P+ layer because diffusion into the N+ type substrate is effected. By using the N+ layer having a relatively small resistivity the resistance of the P+ or N+ layer or the diffused layer between the one power supply circuit and the source becomes smaller than the resistance of the P+ layer. This decreases the turn-ON resistance of the P-channel type or the first conductivity type MOS transistor. As a consequence, the switching speed of the MOS transistor can be increased and the maximum output current can be increased.

Upon comparison under the same impurity concentration, $\rho_N$ is much smaller than $\rho_P$. At a temperature of 300 K., for example, $\rho_N$ is about third times as small as $\rho_P$ in a concentration region of below $10^{18}/cm^3$. It is therefore most effective to apply this invention to a P-channel MOS transistor on an N-type Si-substrate. Where, however, an N-channel MOS transistor is formed on a P-type Si-substrate, the P type impurity concentration can be made higher than the N-type impurity concentration and it is therefore possible to made $\rho_P < \rho_N$. Even if an N-type substrate is used it is possible to make $\rho_P < \rho_N$ in an impurity concentration of about more than $2 \sim 3 \times 10^{20}/cm^3$. From this it will be understood that this invention can be applied to an N-channel MOS transistor.

BRIEF DESCRIPTION OF THE DRAWINGS

Other objects and features of the invention will be apparent from the following description taken in connection with the accompanying drawings in which:

FIG. 1 is a circuit diagram showing by way of example a C-MOS inverter to which this invention can be applied;

FIG. 2 shows an equivalent circuit of the FIG. 1 inverter when a P-channel MOS transistor is in an ON state and an N-channel MOS transistor is in an OFF state;

FIG. 3 shows a pattern structure of a P-channel MOS transistor in the FIG. 1 inverter to which this invention is not applied;

FIG. 4A shows a pattern structure of one form of P-channel MOS transistor embodying this invention, where diffusion layers between one power supply circuit 42 and a source electrode 36 are formed in an N-type substrate and include a P+ layer $36_1$ and an N+ layer $36_2$ connected to the P+ layer 36;

FIGS. 4B and 4C show cross-sectional views as taken along lines 4B—4B and 4C—4C in FIG. 4A, respectively;

FIG. 5 shows an equivalent circuit of the modified FIG. 1 inverter to which a P-channel MOS transistor having an arrangement of FIG. 4A is applied, where the P-channel transistor is in an ON state and the N-channel transistor is in an OFF state;

FIGS. 8 to 10 show modified forms of a P-channel MOS transistor as shown in FIG. 4A or 6A;

FIG. 11 shows an IC pattern when the pattern structure of FIG. 6A is applied to a plurality of MOS transistors; and FIG. 12 shows an electric circuit corresponding to the IC pattern of FIG. 11.

DESCRIPTION OF THE PREFERRED EMBODIMENTS

Figure 7:
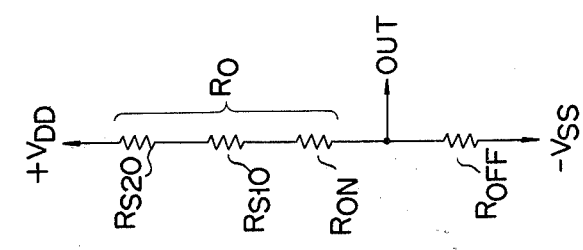
FIG. 7 shows an equivalent circuit of the modified FIG. 1 inverter to which a P-channel MOS transistor having an arrangement of FIG. 6A is applied, where the P- and N-channel transistors are ON and OFF states, respectively.

The preferred embodiments of this invention will be explained below by referring to the accompanying drawings. Like reference numerals are used to designate parts or elements throughout the specification so that an unnecessary duplication can be avoided.

FIG. 1 shows a conventional C-MOS inverter 1. With the input level at +V or logic "1" level an N-channel MOS transistor 10 is in an ON state and a P-channel MOS transistor 12 is in an OFF state. At this time, the output level of the inverter 1 is substantially at −VSS or logic "0" level. When the input varies from the +VDD to the −VSS level the transistor 10 is rendered nonconductive and the transistor 12 is rendered conductive. The output level becomes substantially a +VDD level. FIG. 2 shows an equivalent circuit of the FIG. 1 inverter when the transistors 10 and 12 are in the OFF and ON states, respectively. $R_{OFF}$ is a drain-to-source turn-off resistance of the transistor 10 and $R_{ON}$ is a drain-to-source turn-ON resistance of the transistor 12. $R_S$ is a P+ diffusion layer resistance between the source electrode of the transistor 12 and a power supply circuit of a potential +VDD. Suppose that the power supply circuit has a zero impedance. If in this case the transistor 12 is in the ON state the turn-ON resistance or output impedance of the inverter 1 will be given below.

$$R_o = R_S + R_{ON} \quad (1)$$

The output circuit of the inverter 1 is grounded to a circuit at a zero AC potential i.e. to a substrate through an output capacitance or stray capacitance Cx. Therefore, the inverter 1 has a transfer function of a linear delay system whose time constant is $R_o \cdot C_x$. The greater the time constant $R_o \cdot C_x$ the slower the switching speed of the inverter 1. When Ro is made greater a maximum output current which is derived from the inverter 1 becomes smaller and thus it is impossible to provide a greater fan-out.

FIG. 3 shows a modified form of the FIG. 1 inverter having a general pattern structure in which the P-channel MOS transistor 12 is incorporated. A drain electrode pattern 30 is connected through a contact 32 to a P+ drain region 34 diffusion-formed in an N-type substrate on which a passivation film such as $SiO_2$ is covered. A P+ source region 36 having a width corresponding to a diffusion width (W) of the region 34 is formed by diffusion in the substrate. A gate electrode pattern 38 is formed such that it is located astride the adjacent areas of the regions 34 and 36 with the $SiO_2$ film therebetween. The formation of the pattern 38 is effected, for example, by an Al or poly-Si spattering. Where polysilicone is used for the pattern it is easier to control the gate threshold voltage Vth of the transistor 12. The region 36 is connected through the P+ diffusion layer 36, and contact 40 to the source power supply circuit pattern 42 at the +VDD potential level. Between the patterns 38 and 42 are formed wiring patterns 44 which are used for connection between elements in the integrated circuit. The patterns 30, 42 and 44 are formed by, for example, an Al-spattering. A relatively long spacing L will be needed between the pattern 38 and the pattern 42 to arrange the patterns 44. In consequence, the P+ diffusion layer $36_1$ of W×L has a relatively great resistance $R_S$. Now suppose that the resistivity $\rho_P$ of the P+ layer $36_1$ is $150\Omega/\square$ at W=90 μm and L=78 μm. Then, the resistance $R_S$ will be:

$$R_S = \frac{L}{W} \rho_P = 130\Omega \quad (2)$$

At this time, $R_S$ is of the order of a magnitude which can not be disregarded. If, therefore, the resistance of $R_S$ can be made smaller, the output impedance $R_o$ can be made smaller and thus high-speed switching as well as a greater fan-out of the inverter is assured. When the impedance $R_o$ is decreased the effective transconductance gm of the transistor 12 will be increased, for the following equation is established:

$$gm = \frac{\partial I_D}{\partial V_{GS}} = \frac{\partial I_D}{\partial V_{DS}} \cdot \frac{\partial V_{DS}}{\partial V_{GS}} = \frac{1}{R_O} \frac{\partial V_{DS}}{\partial V_{GS}} \quad (3)$$

where $V_{DS}$: the drain-to-source voltage of the transistor 12
$V_{GS}$: the gate-to-source voltage
ID: the drain current Equation (3) shows that, if $R_O$ is decreased under a given condition ($\partial V_{DS}/\partial V_{GS}$=constant), gm is increased.

FIGS. 4A to 4C show one embodiment of this invention in which a diffusion resistance $R_S$ is made smaller to provide an improved switching speed of the inverter 1, a greater fan-out and a smaller diffusion resistance $R_S$. In this embodiment, an N+ layer $36_2$ of lower resistance is formed in an N-type silicon substrate 45 overlying a metal base 43, such that it is arranged in parallel with a P+ layer $36_1$. A P+ source region 36 is connected through a contact 46 to an interposing pattern 50 on the $SiO_2$ passivation film 48. The pattern 50 is formed by, for example, an Al spattering. The region 36 is connected through the P+ layer $36_1$ of a diffusion width W1 and contact $40_1$ to a source power supply pattern 42. The pattern 42 is usually connected through the base 43 to the substrate 45. The pattern 50 is connected through a contact 52 to an N+ layer $36_2$ having a diffusion width W2. The N+ layer $36_2$ is diffusion-formed in parallel with the P+ layer $36_1$ and connected through a contact $40_2$ to the pattern 42.

FIG. 5 shows an equivalent circuit of the modified FIG. 1 inverter in which a P-channel transistor having a structure as shown in FIG. 4A is used. The resistivity $\rho_N$ of the N+ layer $36_2$ is much smaller than the resistivity $\rho_P$ of the P+ layer $36_1$ in the general impurity concentration region. In FIG. 5, therefore, the diffusion resistance $R_{S2}$ of the N+ layer $36_2$ is smaller than the diffusion resistance $R_{S1}$ of the P+ layer $36_1$. Since the resistance $R_{S2}$ is connected in parallel with the resistance $R_{S1}$ the output impedance $R_O$ of the inverter is decreased. A spacing L2 between the patterns 50 and 38 can be sufficiently reduced and thus the diffusion resistance $R_{S3}$ of the P+ region 36 can be sufficiently decreased.

Suppose that $\rho_P = 150\Omega/\square$ and $\rho_N = 50\Omega/\square$ at $W1 = W2 = 40$ μm and $W3 = 90$ μm. Then, $$R_{S1} = \frac{L1}{W1} \rho_P = 285\Omega \qquad (4)$$

$$R_{S2} = \frac{L1}{W1} \rho_N = 95\Omega \qquad (5)$$

$$R_{S3} = \frac{L2}{W3} \rho_P \approx 13\Omega \qquad (6)$$

where
L1: 76 μm (the distance between the patterns 42 and 50)
L2: 8 μm (the distance between the patterns 50 and 38)

The effective source diffusion resistance $R_S$ is found as follows:

$$R_S = R_{S1}//R_{S2} + R_{S3} \approx 285//95 + 13 \approx 84\Omega \qquad (7)$$

The dimensional requirement for determining $R_S$ is more unfavorable in the arrangement of FIG. 4A than in the arrangement of FIG. 3 (W>W1+W2, L<L1+L2) so long as the magnitude of $R_S$ is concerned. Notwithstanding, $R_S (=84\Omega)$ for the arrangement of FIG. 4A is smaller than $R_S (=130\Omega)$ for the arrangement of FIG. 3. In a switching circuit including a P-channel MOS transistor having a structure of FIG. 4A, therefore, the maximum output current or fan-out is increased and high-speed switching can be attained.

Figure 6A:
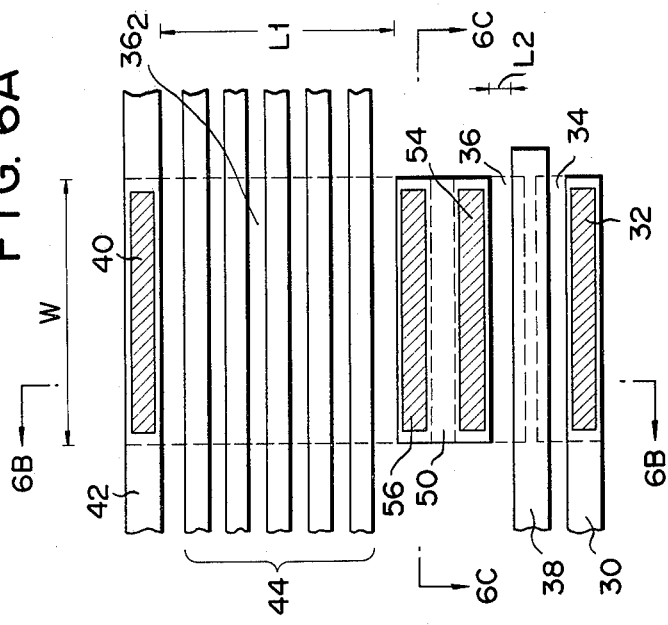
FIG. 6A shows another form of P-channel MOS transistor in the FIG. 1 inverter to which this invention is applied, where diffusion layers between the one power supply circuit 42 and the source electrode 36 are formed on the N-type substrate and include a P+ source region or P+ layer 36 and an N+ layer $36_2$ connected in series with this layer.
Figure 6B:
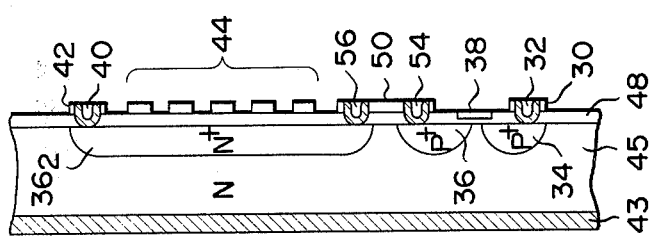
FIGS. 6B and 6C show cross-sectional views as taken along lines 6B—6B and 6C—6C in FIG. 6A, respectively.
Figure 6C:
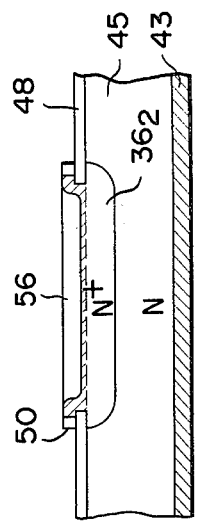

FIGS. 6A to 6C show another form of P-channel MOS transistor 12. In this embodiment, a P+ source region 36 is connected through a contact 54 to an interposing pattern 50. The pattern 50 is connected through a contact 56 to an N+ diffusion layer $36_2$ of a diffusion width W. An N+ layer $36_2$ is connected through a contact 40 to a source power supply circuit pattern 42. In this embodiment the width of the P+ region or P+ layer 36, having a higher resistivity, i.e. a distance L2 between the patterns 50 and 38, is sufficiently shortened. On the other hand, the width of the N+ layer $36_2$ i.e. a distance L1 between the patterns 50 and 42 are set longer, thus assuring a necessary spacing for forming wiring patterns 44.

FIG. 7 is an equivalent circuit of the modified FIG. 1 inverter in which the P-channel transistor 12 having a structure as shown in FIG. 6A is shown. In this embodiment the diffusion resistance $R_{S10}$ of a P+ layer 36 can be sufficiently decreased by narrowing spacing L2. Since the diffusion resistance $R_{S20}$ of the N+ layer $36_2$ is smaller than resistivity $\rho_N$, it becomes smaller than when a P+ layer is used instead. Thus, the effective source diffusion resistance $R_S$ becomes smaller in spite of the fact that $R_{S10}$ and $R_{S20}$ are connected in series with each other. Suppose that $\rho_P = 150\Omega/\square$ and $\rho_N = 50\Omega/\square$ at $W = 90$ μm, $L1 = 76$ μm and $L2 = 8$ μm. Then, $$R_{S10} = \frac{L2}{W} \rho_P \approx 13\Omega \qquad (8)$$

$$R_{S20} = \frac{L1}{W} \rho_N \approx 42\Omega \qquad (9)$$

The effective source diffusion resistance $R_S$ is found as follows:

$$R_S = R_{S10} + R_{S20} \approx 13 + 42 = 55\Omega \qquad (10)$$

$R_S (=55\Omega)$ is much smaller than in the embodiments of FIGS. 3 and 4A. In a switching circuit including a P-channel MOS transistor as shown in FIG. 6A, therefore, it is possible to provide a greater fan-out and high-speed switching.

FIGS. 8 to 10 show another forms of P-channel MOS transistor 12 as shown in FIG. 4A or 6A. In either case, a P+ diffusion layer having a higher resistivity is partly replaced, unlike the conventional structure, by an N+ diffusion layer of a lower resistivity within a diffusion width W range. The effective source diffusion resistance $R_S$ is decreased by the presence of the N+ layer.

FIG. 11 shows a MOS transistor array in which a pattern structure as shown in FIG. 6A is used in a plurality of MOS transistors 12A, 12B, 12C .... FIG. 12 shows an equivalent circuit of the MOS transistor array of FIG. 11. In this MOS transistor array, a connection between P+ source regions 36A to 36C and a source power supply circuit 42 is effected through a single N+ layer $36_2$.

Although in FIGS. 4, 6 and 8 to 11 a rectangular pattern is shown by way of example it may take a variety of configurations. In FIG. 4A, for example, the P+ layer 36 and N+ layer $36_2$ may be curvilinearly formed.

Although specific constructions have been illustrated and described herein, it is not intended that the invention be limited to the elements and constructions disclosed. One skilled in the art will recoginized that the particular elements or sub-constitution may be used without departing from the scope and spirit of the invention.

What we claim is:

1. A MOS integrated circuit including a substrate; a power supply conductor formed on said substrate; a first conductivity type MOS transistor formed on said substrate spaced apart from said power supply conductor and comprising a first conductivity type drain, and a first conductivity type source; means for connecting said source to said power supply conductor comprising generally elongated first conductivity type and second conductivity type layers each having first and second ends, said second conductivity type layer having a resistivity lower than that of said first conductivity type layer, means for coupling said first ends of both said layers to said power supply conductor and for coupling said second ends of both said layers to said source whereby said second conductivity layer is interconnected in parallel with said first conductivity type layer so that a turn-ON resistance between said drain and said source is lowered.

2. A MOS integrated circuit according to claim 1 wherein said power supply conductor is spaced from the source so that other circuit patterns for use in interconnecting circuit elements of the MOS integrated circuit can be arranged between the power supply circuit and the source.

3. A MOS integrated circuit according to claim 1, further including a second conductivity type MOS transistor formed on the substrate to constitute a complementary symmetry inverter circuit together with the first conductivity type MOS transistor.

4. A MOS integrated circuit according to claim 2, further including a second conductivity type MOS transistor formed on the substrate to constitute a complementary symmetry inverter circuit together with the first conductivity type MOS transistor.

5. A MOS integrated circuit according to any one of claims 1, 2, 3 or 4, wherein the power supply conductor is electrically connected to the substrate, whereby the resistance between the power supply conductor and the source is further lowered by a parallel connection of a distributed resistance of the substrate with the second conductivity type layer.

6. A MOS integrated circuit according to any one of claims 1, 2, 3, or 4, wherein the second conductivity type layer is commonly used in a plurality of first conductivity type MOS transistors.

7. A MOS integrated circuit according to claim 5, wherein the second conductivity type layer is commonly used in a plurality of first conductivity type MOS transistors.

* * * * *